(12) United States Patent
Pio (10) Patent No.: US 7,630,263 B2
(45) Date of Patent: Dec. 8, 2009

(54) EXPLOITING A STATISTICAL DISTRIBUTION OF THE VALUES OF AN ELECTRICAL CHARACTERISTIC IN A POPULATION OF AUXILIARY MEMORY CELLS FOR OBTAINING REFERENCE CELLS

(76) Inventor: Federico Pio, Via Volturno, Fontana, 30, I-20047 Brugherio (MI) (IT)

( * ) Notice: Subject to any disclaimer, the term of this patent is extended or adjusted under 35 U.S.C. 154(b) by 153 days.

(21) Appl. No.: 11/318,053

(22) Filed: Dec. 23, 2005

(65) Prior Publication Data

US 2006/0164898 A1 Jul. 27, 2006

(30) Foreign Application Priority Data

Dec. 23, 2004 (IT) .......................... MI2004A2462

(51) Int. Cl.
*G11C 7/02* (2006.01)
(52) U.S. Cl. ............. 365/210.1; 365/185.2; 365/210.15
(58) Field of Classification Search ................. 365/210, 365/185.09, 185.03, 185.22, 210.1, 185.2, 365/210.15
See application file for complete search history.

(56) References Cited

U.S. PATENT DOCUMENTS

| | | | |
|---|---|---|---|
| 6,651,032 B2 * | 11/2003 | Peterson et al. ............. 702/181 |
| 2004/0017718 A1 * | 1/2004 | Ooishi ........................ 365/210 |
| 2004/0032774 A1 * | 2/2004 | Hirano et al. ................ 365/202 |
| 2004/0233727 A1 * | 11/2004 | Iwase et al. ............. 365/185.22 |
| 2005/0024938 A1 * | 2/2005 | Ono et al. .............. 365/185.14 |
| 2005/0117381 A1 * | 6/2005 | Takano et al. ................ 365/145 |
| 2005/0141277 A1 * | 6/2005 | Furuyama .............. 365/185.18 |
| 2006/0126391 A1 * | 6/2006 | Kim et al. .............. 365/185.22 |

\* cited by examiner

*Primary Examiner*—Vu A Le
*Assistant Examiner*—Han Yang
(74) *Attorney, Agent, or Firm*—Blakely, Sokoloff, Taylor & Zafman LLP (57) ABSTRACT

In a semiconductor memory device, a method for obtaining at least one reference cell adapted to be exploited as a generator of a reference signal, the reference signal depending on a value of an electrical characteristic of the at least one reference cell. The method includes providing a population of auxiliary cells, operating on said population of auxiliary cells for varying a value of the electrical characteristic thereof, in such a way that the varied values are statistically distributed in a range including a value of the electrical characteristic corresponding to the reference signal, and choosing the at least one reference cell, wherein choosing includes choosing at least one auxiliary cell in the population of auxiliary cells having the value of the electrical characteristic close to the value corresponding to the reference signal with a pre-defined tolerance.

4 Claims, 6 Drawing Sheets

EXPLOITING A STATISTICAL DISTRIBUTION OF THE VALUES OF AN ELECTRICAL CHARACTERISTIC IN A POPULATION OF AUXILIARY MEMORY CELLS FOR OBTAINING REFERENCE CELLS

PRIORITY CLAIM

This application claims priority from Italian patent application No. MI2004A002462, filed Dec. 23, 2004, which is incorporated herein by reference.

TECHNICAL FIELD

The present invention generally relates to the field of non-volatile semiconductor memories, and, more specifically, the invention relates to non-volatile memories that are electrically programmable.

BACKGROUND

Non-volatile memories are commonly used in several applications when the data stored in the memory need to be preserved even when the power supply is off. Within the class of non-volatile memories, the electrically programmable (and erasable) memories, such as flash memories, have become very popular in applications in which the data to be stored are not immutable (as it might be, e.g., the case of a consolidated code for a microprocessor), being instead necessary from time to time to store new data, or to update the data already stored.

Figure 1:
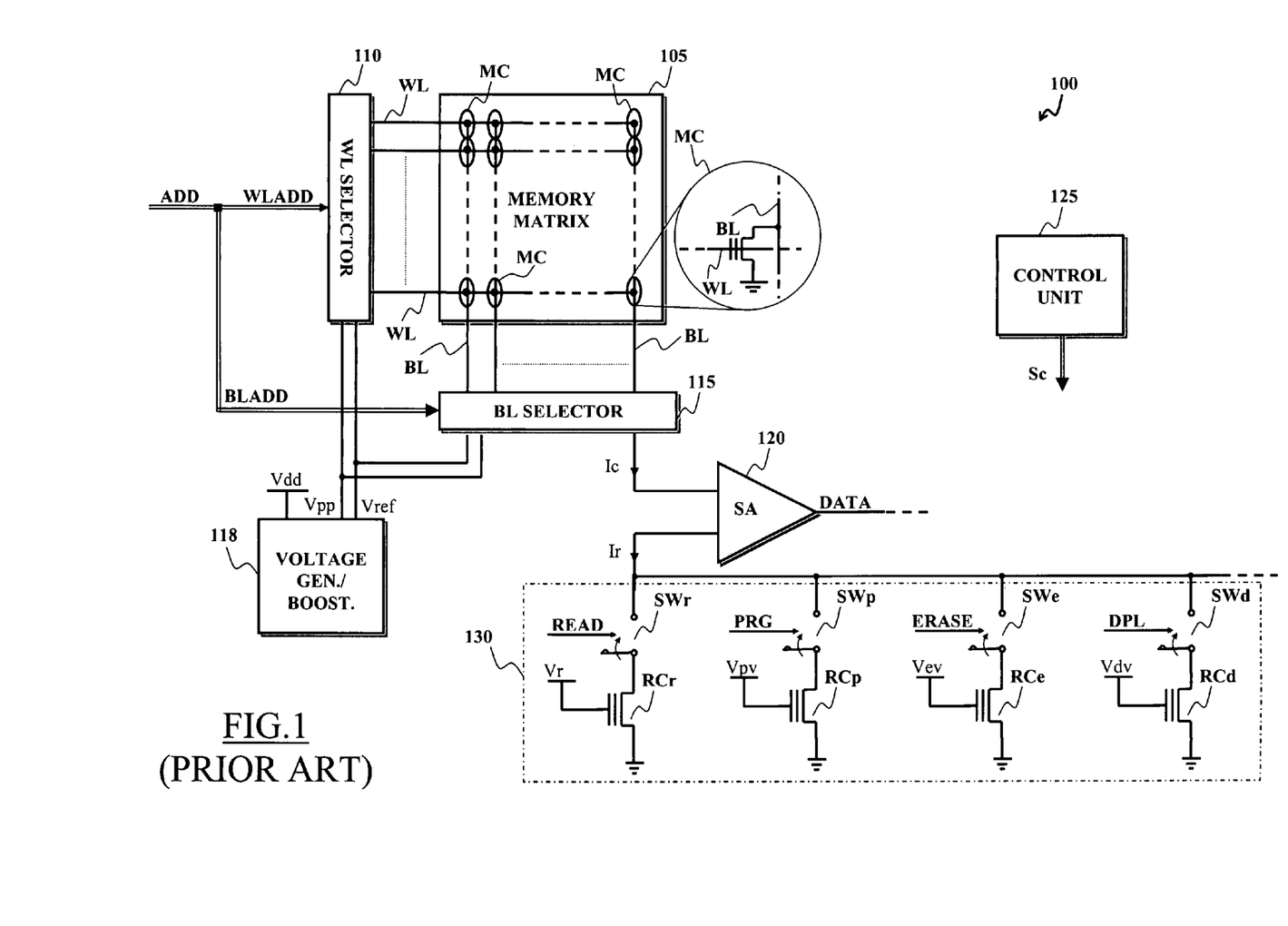
FIG. 1 shows schematically an exemplifying flash memory integrated on a chip of semiconductor material according to concepts known in the art.

Referring to FIG. 1, a non-volatile memory 100, including for example an E²PROM, particularly of flash type, is schematically illustrated. The flash memory 100 is integrated on a chip of semiconductor material and includes a memory matrix 105 of memory cells MC, typically including floating gate MOS transistors. In the memory matrix 105, the memory cells MC are arranged in a plurality of rows and a plurality of columns, for example, with a NOR architecture.

Each row is controlled by a respective word line WL, a control gate terminal of the corresponding memory cells MC being connected thereto, and each column is controlled by a respective bit line BL, a drain terminal of the corresponding memory cells MC being connected thereto; a source terminal of the memory cells MC is connected to a reference voltage supply line providing a reference voltage or ground. In this way, each memory cell MC can be addressed by selecting a corresponding word line/bit line pair.

Word-line selector circuits 110 and bit-line selector circuits 115 are provided; these circuits, known per-se and therefore merely schematized as blocks in the drawings, perform the selection of the word lines WL and of the bit lines BL on the basis of a word-line address binary code WLADD and a bit-line address binary code BLADD, respectively, which are part of a memory address binary code ADD, for example received by the flash memory 100 from an external device (such as a microprocessor) on the occasion of an access to the memory. For example, during a reading operation on the flash memory 100, the word-line selector circuits 110 decode the word-line address code WLADD and select a corresponding one of the word lines WL; the bit-line selector circuits 115 decode the bit-line address code BLADD and typically select a corresponding packet of (e.g., eight or sixteen) bit lines BL.

The word-line selector circuits 110 and the bit-line selector circuits 115 interface with read/write circuits, including all the components which are normally required for reading logic values currently stored in the selected memory cells MC, and for writing desired new logic values thereinto. Particularly, the read/write circuits include voltage generators and boosters 118, such as charge pumps, and a plurality of sense amplifiers 120 (for the sake of clarity only one of those shown in the drawing—the number of sense amplifiers generally depends on the read parallelism, i.e., on the number of bit lines in the selected packets).

The voltage generators and boosters 118 provide a boosted voltage Vpp and a reference supply voltage Vref (for example, the ground) starting from the supply voltage Vdd to the word-line and bit-line selector circuits 110 and 115.

The operation of the flash memory 100 is controlled by a control unit 125, which outputs a plurality of control signals, denoted as a whole with Sc, to be provided to corresponding circuital blocks of the flash memory 100.

The sense amplifier 120 shown in FIG. 1 has an input terminal coupled to the output of the bit line selector circuits 115 for sensing a current Ic sunk by a selected memory cell MC, a current value corresponding to a logic value stored in the memory cell MC.

In the case of a two-level flash memory, the memory cells MC have two possible states, a programmed state, corresponding by convention to a low logic value '0', and a non-programmed, or erased, state, corresponding to a high logic value '1'; these two states are respectively associated, still by convention, with a first, higher value, and a second, lower value of the threshold voltage of the memory cells MC. Thus, a bit of information can be written into a memory cell MC and the current Ic sunk by a selected memory cell MC, when properly biased, corresponds to the stored logic value. Increasing threshold voltages correspond to decreasing memory cell currents Ic and, then, a value of the memory cell current $Ic_{'1'}$, corresponding to the high logic value '1', is greater than a value of the memory cell current $Ic_{'0'}$, corresponding to the low logic value '0'.

In a multi-level flash memory 100, each memory cell MC may be programmed to multiple levels, each one associated with a corresponding range of the threshold voltage of the cells; each programming level represents a different logic value. Typically (but not necessarily), a number L of levels is a power of 2; therefore, a memory cell MC with $L=2^B$ levels stores a logic value consisting of B bits of information.

The memory cell MC can be programmed by applying a high (positive) voltage pulse to the control gate terminal, i.e., to the respective word line WL, and to the drain terminal, i.e., to the respective bit line BL, with respect to the source terminal and to a semiconductor well of the chip in which it is integrated (which well can be biased at a negative voltage with respect to the source terminal). The so-applied voltages supply sufficient energy to some electrons (so-called "hot") flowing through a channel of the floating gate transistor to cause them to be injected into the floating gate. The charge transferred into the floating gate increases the threshold voltage of the cell, and it is retained for any practical time period.

A programmed memory cell MC can be erased by removing electrons from its floating gate; particularly, a high (negative) voltage pulse can be applied to the control gate terminal, i.e., to the respective word line WL, with respect to the source terminal and the semiconductor well of the chip in which it is integrated (while the drain terminal, i.e., the respective bit line BL, can be left floating). This voltage generates a Fowler-Nordheim current by quantum-mechanical tunneling, current flowing between the floating gate and the well and the source terminal, and which removes the charge from the floating gate.

The flash memory 100 further includes an alignment 130 of a number of reference cells RCr, RCp, RCe, RCd structurally identical to the memory cells MC. The sense amplifier 120 has a reference input terminal selectively coupable to a reference cell RCr, RCp, RCe, RCd of the alignment 130 that, when connected to the sense amplifier 120 (and properly biased), provides a reference current Ir to be compared with the current Ic to be sensed, so as to discriminate the logic value stored in the selected memory cell MC, or to verify a correct programming or erase (not too high, not too low) level of the considered memory cell MC.

An output terminal of the sense amplifier 120 provides an output signal DATA taking a high or low logic value in accordance with the programming state of the selected memory cell MC.

The flash memory 100 can include a plurality of alignments 130 of reference cells RCr, RCp, RCe, RCd (only one of those is shown in FIG. 1 for simplicity of illustration), exploited during reading or verify operations on the memory cells MC. Typically, the number of the reference cells RCr, RCp, RCe, RCd depends on the storage capability and on the architecture of the flash memory 100 and on the fact that the flash memory 100 is multi-level.

In an exemplificative way the reference cells RCr, RCp, RCe, RCd are kept conductive by applying a respective proper biasing voltage Vr, Vpv, Vev, Vdv, which depends on the operation to be performed (read, program verify, erase verify, depletion verify) on the cells MC, at the control gate terminal thereof, while the source terminal is maintained at ground.

Switches SWr, SWp, SWe, SWd have each a first terminal connected to a drain terminal of a respective one of the reference cells RCr, RCp, RCe and RCd, and a second terminal connected to the reference terminal of the sense amplifier 120. Each of the switches SWr, SWp, SWe, SWd is controlled by a respective control signal READ, PRG, ERASE, DPL provided by the control unit 125 so that the corresponding reference cell RCr, RCp, RCe, RCd sinks a reference current Ir only when it is connected to the sense amplifier 120, the reference current Ir depending on the programming state of the reference cell RCr, RCp, RCe, RCd.

Each reference cell RCr, RCp, RCe, RCd is exploited in a respective operation to be performed on the selected memory cells MC. Particularly, during a post-manufacture testing phase of the memory device a specific task (read, program verify, erase verify, depletion verify) is assigned to each reference cell RCr, RCp, RCe, RCd that, accordingly, is programmed in such a way to have a suitable threshold voltage specific for that task.

For example, a read reference cell RCr is exploited during reading operations on the memory matrix 105 for discriminating the logic value stored in a memory cell MC selected for the reading thereof. During the reading operation the control unit 125 asserts a read control signal READ, so as to connect the read reference cell RCr to the sense amplifier 120. The read reference cell RCr is programmed at a read threshold voltage such that a value of the reference current Ir sunk by it (when properly biased) is, for example, intermediate between the value of the high memory cell current $Ic_{\cdot 1}$ and the low memory cell current $Ic_{\cdot 0}$.

A program verify reference cell RCp is exploited during program-verify operations on the memory matrix 105, e.g., for verifying the completion of a program operation on a selected memory cell MC. During a program-verify operation the control unit 125 asserts a program verify control signal PRG so as to connect the program verify reference cell RCp to the sense amplifier 120. The program verify reference cell RCp is programmed at a level corresponding to the low logic value '0' and, accordingly, has a program-verify threshold voltage typically higher than the read threshold voltage (in order to assure that the cells are programmed with a suitable margin).

An erase verify reference cell RCe is exploited during erase-verify operations on the memory matrix 105 for verifying the completion of an erase operation on selected memory cells MC. During an erase-verify operation the control unit 125 asserts an erase verify control signal ERASE, so as to connect the erase verify reference cell RCe to the sense amplifier 120. The erase verify reference cell RCe is programmed at the level corresponding to the high logic value '1' and, accordingly, has an erase-verify threshold voltage lower than the read threshold voltage (in order to assure that the cells are erased with a suitable margin).

A depletion verify reference cell RCd is exploited during depletion-verify operations on the memory matrix 105, for verifying that, after an erase operation, the threshold voltage of selected memory cells MC has not reached a value excessively low or even negative. During a depletion-verify operation the control unit 125 asserts a depletion verify control signal DPL, so as to connect the depletion verify reference cell RCd to the sense amplifier 120. The depletion verify reference cell RCd is programmed at a level corresponding to the high logic value '1' and a depletion-verify threshold voltage thereof corresponds to an inferior limit of the threshold voltage acceptable for the memory cells MC, accordingly lower than the erase-verify threshold voltage.

In the case the flash memory 100 is multi-level, the reference cells RCr, RCp exploited during a reading or verify operation on the memory cell MC are typically in a number greater than one. For example, in a four-level flash memory 100 during a reading operation up to three read reference cells RCr may be necessary, for being able to discriminate the four programming states of the memory cells MC; as many reference cells (programmed at voltage levels slightly higher than those of the read reference cells) are necessary for the program verify.

During the post-manufacture testing phase of the memory devices all the reference cells RCr, RCp, RCe, RCd are programmed at the desired level by a programming/erasing procedure requiring a relatively long time, typically of the order of seconds. In fact, each reference cell RCr, RCp, RCe, RCd has to reach the desired threshold voltage with a relatively high accuracy, especially in the case of a multi-level flash memory 100, in which each threshold voltage range corresponds to a different logic value, and the difference between the different threshold voltage values is rather small. For each reference cell RCr, RCp, RCe, RCd a program-verify sequence and an erase-verify sequence are typically repeated several times until the desired threshold voltage is reached with the required accuracy, because the programming/erasing procedure is very sensitive to process variations, which affect the gate oxide thickness, the inter-poly dielectric thickness, the active area width, the gate length and the like, and which have a strong impact on the programming efficiency. Accordingly, the relatively long time required for correctly setting the reference cells in the testing phase of the memory may substantially increase the cost of the flash memory 100.

Quite similar problems are found in the case of other types of non-volatile semiconductor memories, such as the phase-change memories (also known as "Ovonics Universal Memories" or OUM), in which the resistance variation caused by the phase change (from crystalline to amorphous) of suitable materials is exploited for storing information.

SUMMARY

In view of the state of the art outlined in the foregoing, one of the problems faced has been how to provide a non-volatile semiconductor memory with costs greatly reduced thanks to a procedure for programming reference cells which is faster with respect to the procedure known in the art.

It has been found that instead of spending time trying to carefully program a single reference cell to the target reference threshold voltage value (an operation which, moreover, has to be repeated for every reference cell, correspondingly to the different operations to be performed on the memory cells), one can advantageously exploit the natural or induced statistical distribution of threshold voltages that is obtained when a population of cells undergoes a programming. Thus, by providing a sufficient number of auxiliary cells (where auxiliary means in addition to the cells assigned to store data), and by submitting all of them to a programming, or an erasure (possibly by slightly modifying the respective programming/erasure conditions), a statistical distribution of threshold voltages is obtained, and it is almost always possible to find, among the plurality of auxiliary cells, an auxiliary cell that has reached the target threshold voltage value, or that has a threshold voltage suitably close to the target value: this cell can thus be chosen as the reference cell for a given operation. Similar considerations apply in the case of semiconductor memories in which mechanisms different from the threshold voltage variation of MOS transistors are exploited for storing information, such as in the OUM memories: in general, it has been found that it is possible to exploit the natural or induced statistical distribution of the values of an electrical characteristic of a population of auxiliary cells.

Therefore, in a semiconductor memory device, a method according to an embodiment of the invention obtains at least one reference cell adapted to be exploited as a generator of a reference signal that depends on a value of an electrical characteristic of the reference cell. The method includes: providing a population of auxiliary cells; operating on the cells of said population of auxiliary cells for varying a value of the electrical characteristic thereof, in such a way that the varied values are statistically distributed in a range including a value of the electrical characteristic corresponding to the desired reference signal; and choosing the at least one reference cell among the population of auxiliary cells having the value of the electrical characteristic close to the value of the electrical characteristic corresponding to the desired reference signal with a pre-defined tolerance.

BRIEF DESCRIPTION OF THE DRAWINGS

Features and advantages of the present invention will be made apparent by the following detailed description of some embodiments thereof, provided merely by way of non-limitative examples, description that will be conducted making reference to the attached figures, in which.

Figure 2:
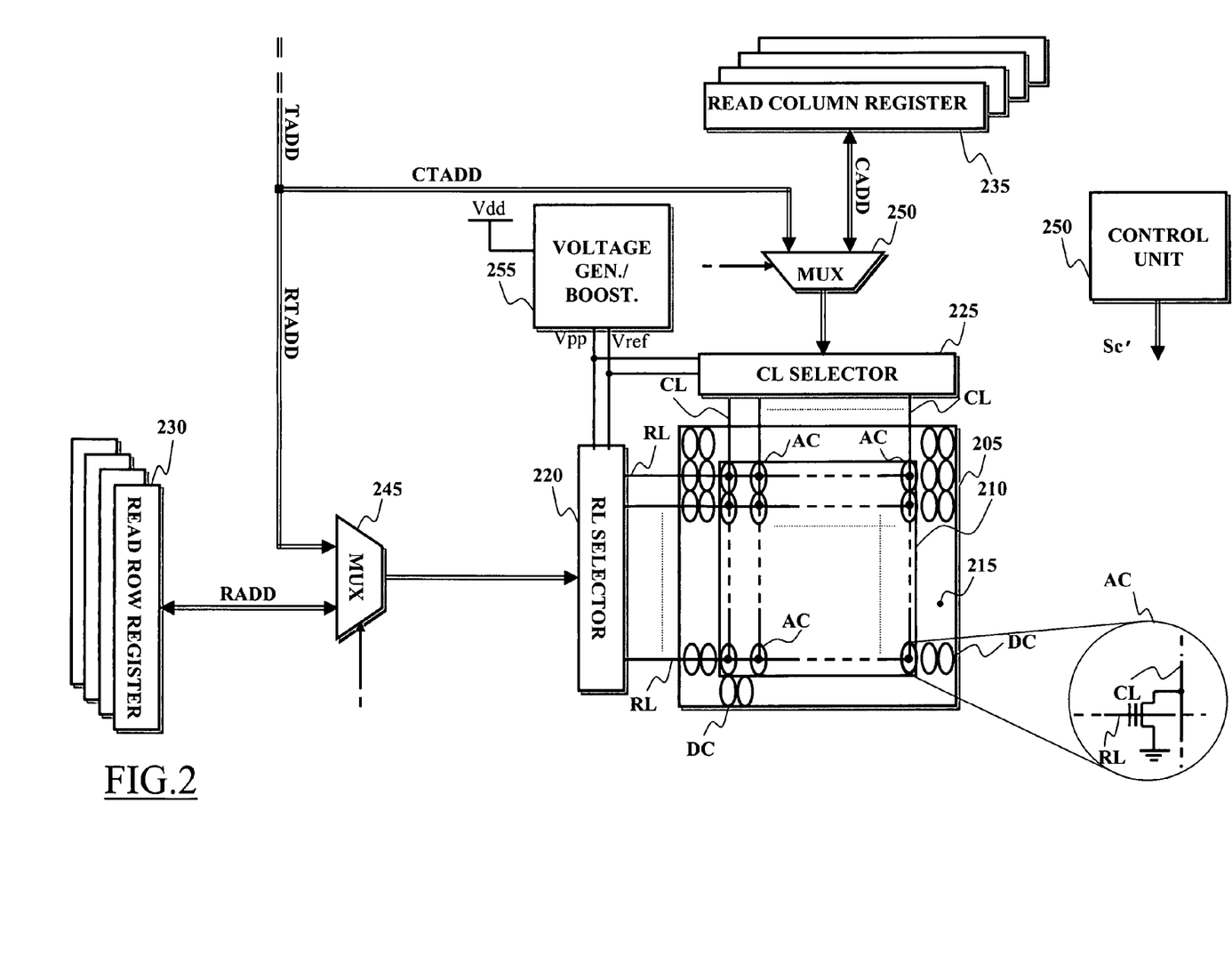
FIG. 2 illustrates schematically an array of auxiliary cells included in a flash memory according to an embodiment of the present invention.

With reference to the drawings, in particular to FIG. 2, an array 205 of auxiliary cells AC (hereinafter, also referred to as an auxiliary array) and of dummy cells DC is schematically illustrated; according to an embodiment of the present invention, the array 205 is included in a non-volatile semiconductor memory, e.g., an $E^2PROM$ of flash type, for example in the flash memory 100 schematized in FIG. 1 already described in the foregoing, in place of the alignment 130 of reference cells illustrated therein. The auxiliary cells AC and the dummy cells DC can be structurally identical to the memory cells of the memory matrix 105, which typically includes floating gate MOS transistors, as described above with reference to FIG. 1.

The auxiliary cells AC in the array 205 are arranged in a plurality of rows, controlled by respective row lines RL, and a plurality of columns, controlled by respective column lines CL, for example with a NOR architecture as the memory matrix 105 of FIG. 1. Accordingly, each auxiliary cell AC can be addressed by means of a corresponding row line/column line pair, similarly to a memory cell MC in the memory matrix 105, which is addressed by means of a corresponding word line/bit line pair.

The dummy cells DC in the auxiliary array 205 are typically provided in a given number at edges of the auxiliary array 205 in such a way that the auxiliary cells AC, more internal, are not significantly affected by edge effects, and their electrical behavior is as similar as possible to the electrical behavior of the memory cells MC in the memory matrix 105. Particularly, the dummy cells DC are not electrically active, missing, for example, electrical contacts to the column lines, and for example form a sort of boundary frame 215 for the auxiliary cells AC inside the auxiliary array 205.

Row line selector circuits 220 and column line selector circuits 225 are also provided, for the selection of the row lines RL and of the column lines CL, respectively, on the basis of a corresponding address, in a way similar to the memory cells MC in the memory matrix 105.

The plurality of auxiliary cells AC particularly includes a number of auxiliary cells AC exploited as reference cells during, e.g., reading or verify operations on the memory cells MC of the memory matrix 105. The reference cells are chosen among the auxiliary cells AC by selecting those auxiliary cells AC that have a desired threshold voltage, as it will be described in greater detail in the following.

The flash memory according to an embodiment of the present invention further includes a plurality of non-volatile row address registers 230, each one for storing a row address RADD of a respective row line RL of the array 205 to which a cell AC, chosen among the auxiliary cells AC in the array 205 as reference cell for a given operation to be performed on the cells MC, belongs. A plurality of non-volatile column-address registers 235 is also provided, each one for storing a column address CADD of a respective column line CL of the array 205 to which the reference cell chosen among the auxiliary cells AC belongs.

During a testing procedure of the memory 100, during which the reference cells that have to be exploited in the normal operative life of the memory for performing the different operations (read, program verify, etc.) are set and chosen, a test address TADD is provided to the array 205, for example, by a test machine (not shown) external to the memory 100 for selecting corresponding auxiliary cells AC, e.g., for performing the programming. A first portion RTADD of the test address TADD is provided to a row multiplexer (mux) 245 at a first input terminal thereof; the row mux 245 also receives the row address RADD from the row registers 230 at a second input terminal (the address stored in the row registers will be exploited in the normal operative life of the memory). A second portion CTADD of the test address TADD is provided to a column mux 250 at a first input terminal thereof; the column mux 250 also receives the column address CADD from the column registers 235 at a second input terminal (the address stored in the column registers will be exploited in the normal operative life of the memory). The two muxes 245 and 250 provide either the respective portion RTADD, CTADD of the test address TADD or the address RADD, CADD stored in the registers 230 and 235 to the row line selector circuits 220 and to the column line selector circuits 225, respectively.

A control unit 250 of the flash memory 100 (for example, included in the control unit 125 depicted in FIG. 1) outputs a plurality of control signals, denoted as a whole with Sc', particularly for controlling the selection of the auxiliary cells AC; accordingly, corresponding control signals are provided to the two muxes 245 and 250 for selecting the test address TADD, or the addresses RADD and CADD stored in the registers 230 and 235. Alternatively, the test address TADD can also be provided by the control unit 250.

During the testing procedure on the flash memory according to an embodiment of the present invention, a single programming pulse can be applied in parallel to a given number (possibly all) of the column lines CL, and to one or more (possibly all) row lines RL of the auxiliary array 205 of the flash memory. The programming pulse is applied, for example, by means of voltage generators and boosters 255 of the flash memory, which expediently can include the voltage generator and boosters (118 in FIG. 1) already provided for programming the memory cells MC in the memory matrix 105. Particularly, the voltage generators and boosters 255 provide a boosted voltage Vpp and a reference voltage Vref (such as ground) starting from the supply voltage Vdd of the flash memory to the selector circuits 220 and 225 of the row lines RL and column lines CL. For example, during the program operation on the auxiliary cells AC, the selected column lines CL are brought at a positive voltage sufficiently high, while the not-selected column lines CL are, for example, left floating, or maintained at ground, as the source terminals of the auxiliary cells AC, while the programming pulse can be applied in parallel to all the selected row lines RL.

After a single-pulse program operation, the threshold voltage of each auxiliary cell AC reaches a respective value in a voltage range centered around a threshold voltage value corresponding to the specific biasing conditions.

Figure 3:
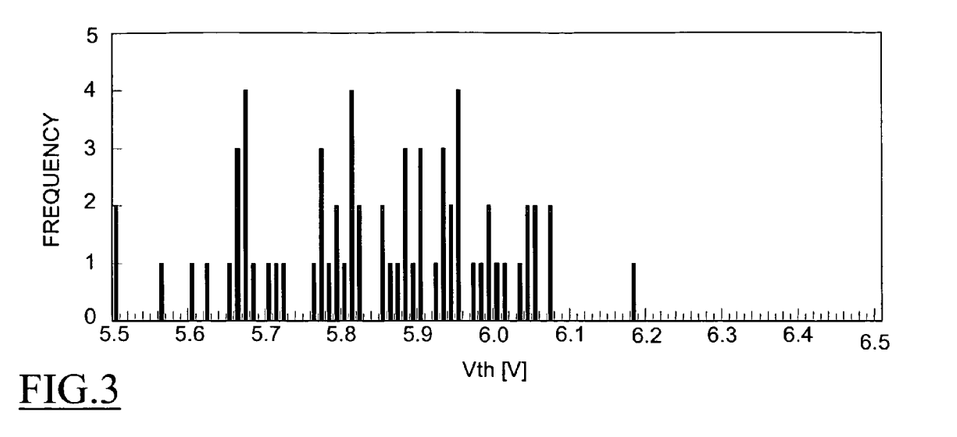
FIG. 3 shows a distribution of the threshold voltages of the auxiliary cells after a single-pulse program operation, according to an embodiment of the present invention.

Let it be assumed that the auxiliary array 205 includes, for example, 66 auxiliary cells AC. FIG. 3 shows a distribution of the threshold voltages thereof, the threshold-voltage values Vth being taken on the abscissa and the number of auxiliary cells AC for each threshold voltage value (or statistical frequency) being taken on the axis of ordinates; a bin width on the abscissa is of 10 mV. Particularly, it can be observed that the program biasing conditions in the considered example have generated a threshold-voltage distribution around a voltage value Vth of 5.9 V.

By a preliminary electrical characterization of the MOS transistors forming the memory cells MC or auxiliary cells AC, it is possible to estimate the typical program biasing conditions (biasing voltages, time of application) necessary to obtain at least one auxiliary cell AC having a desired threshold voltage (target threshold voltage) among a given number of auxiliary cells AC. Accordingly, considering a relatively high number (such as 66) of auxiliary cells AC, it is possible to estimate a statistical distribution of the threshold voltages thereof depending on the program biasing conditions.

After a single-pulse program operation on the auxiliary cells AC, a search operation is performed on the auxiliary array 205 for finding an auxiliary cell AC having a threshold voltage sufficiently close to the target value.

Referring to FIG. 2 in conjunction with FIG. 3, it is supposed that the auxiliary array 205 has to be programmed in such a way to obtain a reference cell to be exploited in a program verify operation on the memory cells MC of the memory matrix 105, for example, a program verify reference cell having a read threshold voltage of about 5.9 V with a predefined tolerance. To this purpose, for example by means of the write circuits of the flash memory normally used to program the memory cells MC of the memory matrix 105, a single-pulse program operation on the array 205 is performed, the programming pulse having a voltage amplitude and a duration corresponding to the target threshold voltage, for example about 4 V on the drain terminal, applying to the control gate (and then to the row line) a voltage ramp going from about 3 V to about 4 V in about 7 μs.

Then, for example, the external test machine starts the search operation and provides a first test address TADD corresponding to a first row line RL and to a first column line CL, for selecting a first auxiliary cell AC in the auxiliary array 205. The external test machine 240 estimates the threshold voltage of a first addressed auxiliary cell AC, as described in greater detail in the following. If the threshold voltage of the first addressed auxiliary cell AC is sufficiently close to the target value, then this auxiliary cell AC is chosen as program verify reference cell to be exploited in the future operative life of the flash memory in a read operation on the memory cells MC, and the external test machine stops the search operation on the array 205. Otherwise, the external test machine continues the search operation on a second auxiliary cell AC, and so on, until an auxiliary cell AC that has been programmed to the target level is encountered, or the threshold voltage of which is sufficiently close to said value.

When an auxiliary cell AC having a threshold voltage equal or properly close to the target value is identified, the corresponding binary code of the test address TADD provided by the external test machine for addressing that auxiliary cell AC is stored in a non-volatile way in the registers 230 and 235 of the flash memory, particularly in registers 230 and 235 assigned to the storage of the address of the reference cell for the program verify operation. Then, the row address RADD and the column address CADD stored in the respective registers 230 and 235 take the address binary code of the corresponding portions RTADD and CTADD of the test address TADD that corresponds to the auxiliary cell AC chosen since having the threshold voltage equal or sufficiently close to the target value. In detail, the binary code of the first portion RTADD provided to the row-line selector circuits 220 is stored into a read row register 230, while the binary code of the second portion CTADD provided to the column line selector circuits 225 is stored into the read column register 235. If no auxiliary cell with a suitable threshold voltage value is found, the operation can be repeated, in case the programming being performed after an erasure of the just programmed cells.

Similar single-pulse program operations can be performed also for obtaining reference cells to be exploited in read, erase-verify or depletion-verify operations on the memory cells MC of the memory matrix 105; auxiliary cells AC having threshold voltage adapted to discriminate the two programming state of the cells MC during the reading thereof, or to verify the erased or depleted condition of the memory cells MC, as described in the foregoing with reference to FIG. 1, will be selected in such a case as reference cells. For example, the auxiliary array 205 may be partitioned into a plurality of array portions, each portion assigned to a given operation (read, program verify, erase verify, depletion verify, and so on). In this way, a respective single programming pulse can be applied to the auxiliary cells of each auxiliary array portion, the characteristics of the programming pulse, e.g. its duration, and the voltage values, depending on the target threshold voltage suitable to the specific operation.

After having applied the programming pulses, a search operation conducted, for example, by the external test machine in the different auxiliary array portions allows finding the auxiliary cells AC having the required threshold voltages, and the addresses of the auxiliary cells found are stored in a non-volatile way in the row and column registers 230 and 235 assigned to the respective array portions.

In another embodiment of the invention, a single program operation by a single pulse on the auxiliary array 205 is exploited for obtaining all the target threshold voltage values required for the different operations (read, program-verify, erase-verify, depletion-verify, and so on) of the flash memory 100. To this purpose, the program biasing conditions of the auxiliary cells can be varied in time, in such a way to obtain a sufficiently spread threshold voltage distribution in the array 205, encompassing all the desired target values.

A possible way to achieve such an end is described with reference to FIG. 4, in which a number N of auxiliary cells AC-1-AC-N of the array 205, in particular all controlled by a same row line RL and each one by a respective column line CL-1-CL-N, is shown, according to an embodiment of the present invention. Each column line CL-1-CL-N is selectively connectable, by means of a respective switch SW-1-SW-N, to a drain voltage supply line Vdr adapted to provide a drain supply voltage Vdr.

In detail, the switch SW-1-SW-N has a first terminal connected to a respective column line CL-1-CL-N and a second terminal connected to the drain voltage supply line Vdr. Each switch SW-1-SW-N is enabled by a respective enabling signal EN-1-EN-N, provided by the control unit 250.

The drain voltage supply line Vdr in turn is coupled to a drain voltage generator 405 included, for example, in the voltage generators and boosters 255 of the flash memory. The drain voltage generator 405 provides the drain supply voltage Vdr taking a value corresponding to the operation to be performed on the auxiliary cells AC-1-AC-N, as described in greater detail in the following.

Similarly, the row line RL is coupled to a gate voltage generator 410, included, for example, in the voltage generators and boosters of the flash memory, providing a gate voltage Vg, taking a value corresponding to the operation to be performed on the auxiliary cells AC-1-AC-N.

Figure 4:
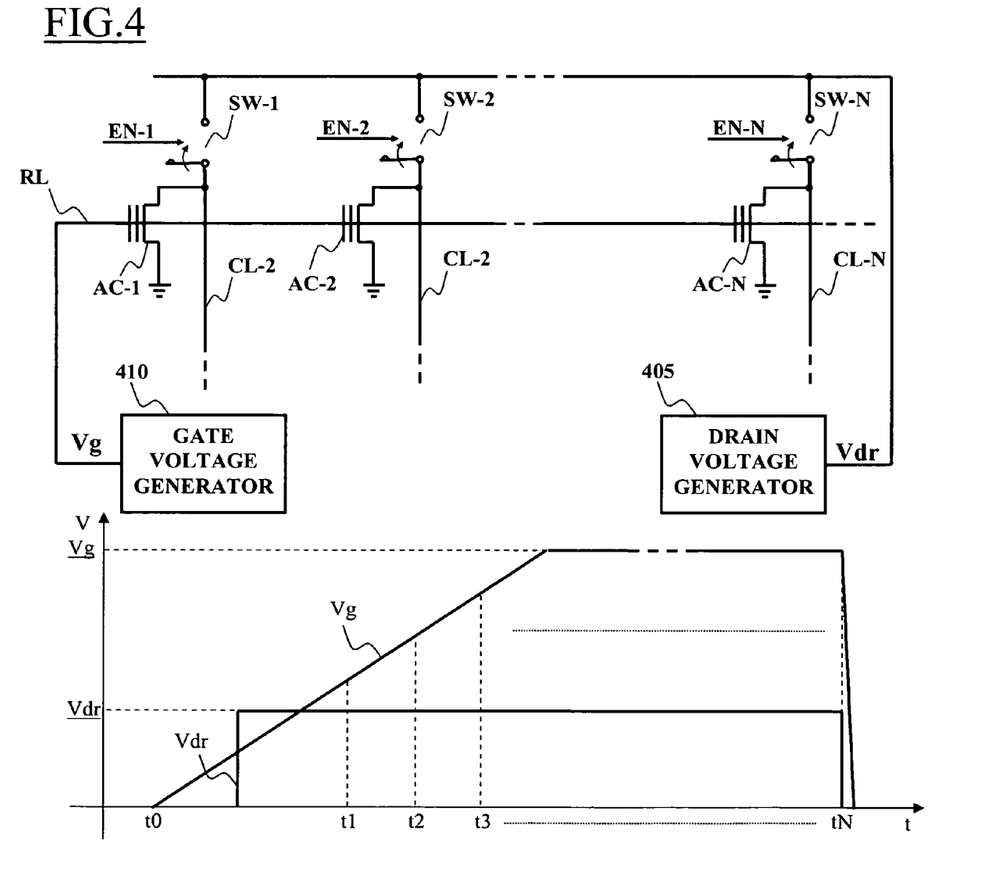
FIG. 4 shows a number N of auxiliary cells of the array of FIG. 2, controlled by a control line, and a graphic representation vs. time of voltages applied to drain and control gate terminals of the N auxiliary cells during a single-pulse program operation, according to an embodiment of the present invention.

Furthermore, in FIG. 4 the drain supply voltage Vdr and the gate voltage Vg vs. time is graphically represented, during a single-pulse program operation on the N auxiliary cells AC-1-AC-N according to an embodiment of the present invention.

The gate voltage generator 410 applies a single pulse to the row line RL and the gate voltage Vg increases as a ramp, starting at an initial time t0 and reaching a maximum value Vg, for example a ramp staring from about 3 V and going up to about 8 V in about 5 μs, and which remains at such a value about for further 5 μs, while the drain supply voltage Vdr is maintained at a constant value Vdr, for example about 4 V. As it is known, in such conditions the threshold voltage of the cells undergoing a programming grows proportionally to the gate voltage ramp.

At the beginning of the single-pulse program operation all the enabling signals EN-1-EN-N are asserted, so that all the switches SW-1-SW-N are closed, i.e., all the column lines CL-1-CL-N are connected to the drain voltage supply line Vdr.

When, at a first time t1, the gate voltage Vg reaches a predetermined value, corresponding to a first one of the desired target values of the threshold voltage, the first enabling signal EN-1 is de-asserted for opening the first switch SW-1 corresponding to the first auxiliary cell AC-1. Accordingly, the first auxiliary cell AC-1 is programmed by a ramp pulse of duration t1-t0, i.e., its programming stops at the time t1, because the gate voltage Vg, even if still applied to the control gate thereof after the time t1, does not substantially further modify the threshold voltage of the first auxiliary cell AC-1 because the corresponding drain terminal is floating.

After a predefined time period T, at a second time t2 a second enabling signal EN-2 is de-asserted for opening a second switch SW-2 corresponding to a second auxiliary cell AC-2. Accordingly, the second auxiliary cell AC is programmed by a ramp pulse of duration t2-t0 longer than t1-t0. Thus, the second auxiliary cell AC-2 typically has a threshold voltage higher than the threshold voltage of the first auxiliary cell AC-1.

Similarly, also the switches SW-3-SW-N are sequentially opened at respective times t3-tN; after the time tN, the gate voltage pulse can rapidly decrease to zero. It has to be observed that only a portion of the auxiliary cells AC-1-AC-N is programmed by a pulse reaching the maximum value Vg-Vdr (in the example, the cells AC-3-AC-N), and also between such cells each auxiliary cell is programmed by a pulse of a respective duration, different from that of the other cells, and therefore for such cells the threshold voltage will be as higher as the application time of the programming voltages is longer.

The above-described method of programming the auxiliary cells AC-1-AC-N, according to an embodiment of the present invention, obtains a spread distribution of the threshold voltages, thanks to the fact that the auxiliary cells AC-1-AC-N are sequentially disconnected from the drain voltage supply line Vdr, rendering their drain terminals floating.

Figure 5:
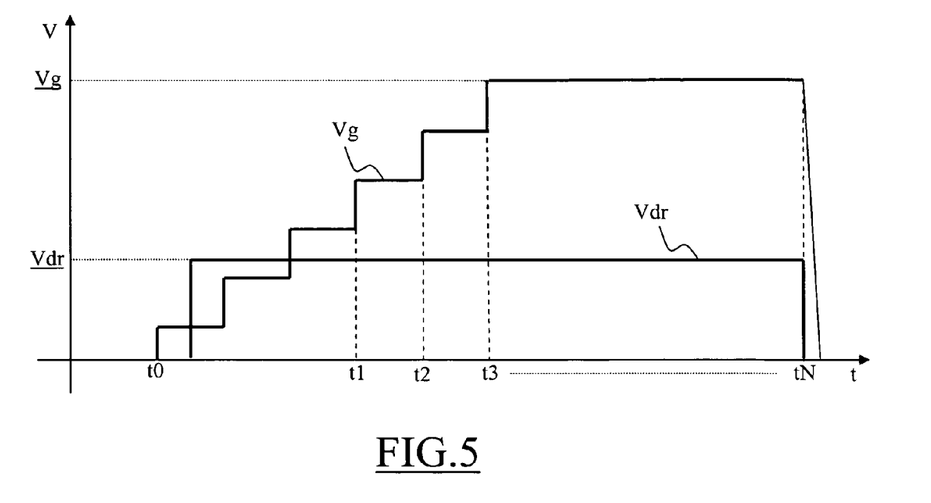
FIG. 5 illustrates a graphic representation vs. time of the voltages applied to the drain and control gate terminals of the N auxiliary cells shown in FIG. 4 during a single-pulse program operation, according to a further embodiment of the present invention.

In FIG. 5 the drain supply voltage Vdr and the gate voltage Vg vs. time is graphically represented during a single-pulse program operation on the auxiliary cells AC-1-AC-N of FIG. 4, according to a further embodiment of the present invention.

The gate voltage generator applies a single pulse to a row line RL of the auxiliary array 205 and the gate voltage Vg increases as a non-continuous, but staircase, ramp, which starts at an initial time t0 and which reaches a maximum value Vg (for example, a ramp staring from about 3 V and going to about 8 V, with increments of about 200 mV), each step of the ramp having, for example, a duration T of about 200 ns. The drain supply voltage Vdr is maintained at a constant value Vdr (for example, about 4 V) for the duration of the program operation.

As in the above-described embodiment, at the beginning of the single-pulse program operation all the enabling signals EN-1-EN-N are asserted to keep all the column lines CL-1-CL-N connected to the drain voltage supply line Vdr.

When the gate voltage Vg reaches, at a first time t1 after, for example, four steps of the gate voltage Vg, a predefined value, corresponding to a first one of the target values, the first enabling signal EN-1 is de-asserted for opening the first switch SW-1.

After a next step, at a second time t2 the second enabling signal EN-2 is de-asserted for disabling the second switch SW-2.

Similarly, also the switches SW-3-SW-N are sequentially opened at respective times t3-tN, at the end of each step in the gate voltage and, when the maximum gate voltage Vg is reached, at successive time ranges equal to or even different from the previous ones; then, the gate voltage pulse can rapidly decrease to zero.

Considering now FIG. 6A, a threshold-voltage distribution of the auxiliary cells is shown, experimentally obtained by a single-pulse program operation according to the embodiments of the present invention described with reference to FIG. 4 and FIG. 5. The threshold voltage values Vth are taken on the abscissa, the statistical frequency on the ordinates; a bin width on the abscissa is of 10 mV.

The voltage range, in which the threshold voltage values Vth of the auxiliary cells AC-1-AC-N fall, depends on the biasing program conditions, i.e., on the drain supply voltage Vdr, on the gate voltage Vg, and on the duration of the program pulse for each auxiliary cell.

Particularly, in the considered example the auxiliary array 205 includes 80 auxiliary cells, whose threshold voltages Vth fall in a range between 2 V and 9 V.

Figure 6A:
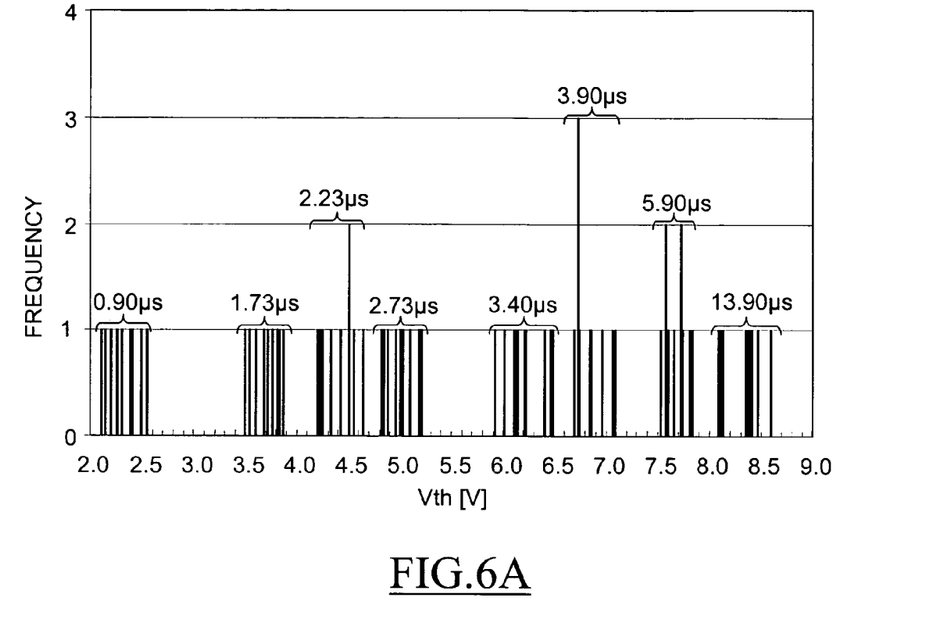
FIG. 6A shows a threshold voltage distribution of the N auxiliary cells of FIG. 4, experimentally obtained by a single-pulse program operation according to the embodiments of the present invention of FIG. 4 and FIG. 5.

Moreover, in the case reported in FIG. 6A the auxiliary cells have been sequentially disconnected from the drain voltage supply line Vdr in groups, instead that one by one, for example in groups of ten auxiliary cells at time. In such a way, groups of auxiliary cells with threshold voltages distributed around the different target threshold voltage values have been obtained. It is thus possible to find the desired reference cells between the auxiliary cells having threshold voltage values suitable for each operation on the memory cells, without the need to partition the array into portions to be programmed with different pulses.

In particular, a first group of cells has been disconnected from the drain voltage supply line Vdr after a time of 0.90 μs and the obtained threshold-voltage values Vth are distributed roughly around 2.3 V. A second group has been disconnected after a time of 1.73 μs and the obtained threshold-voltage values Vth are distributed roughly around 3.7 V. A third group has been disconnected after a time of 2.23 μs and the obtained threshold-voltage values Vth are distributed roughly around 4.5 V. A fourth group has been disconnected after a time of 2.73 μs and the obtained threshold-voltage values Vth are distributed roughly around 5.0 V. A fifth group has been disconnected after a time of 3.40 μs and the obtained threshold-voltage values Vth are distributed roughly around 6.3 V. A sixth group has been disconnected after a time of 3.90 μs and the obtained threshold-voltage values Vth are distributed roughly around 6.8 V. A seventh group has been disconnected after a time of 5.90 μs and the obtained threshold voltage values Vth are distributed roughly around 7.7 V. An eighth group has been disconnected after a time of 13.90 μs and the obtained threshold voltage values Vth are distributed roughly around 8.3 V.

In the case of FIG. 6A the threshold-voltage distribution is roughly uniform in the range between 2.0 V and 9.0 V, with peaks concentrated around predefined values.

Figure 6B:
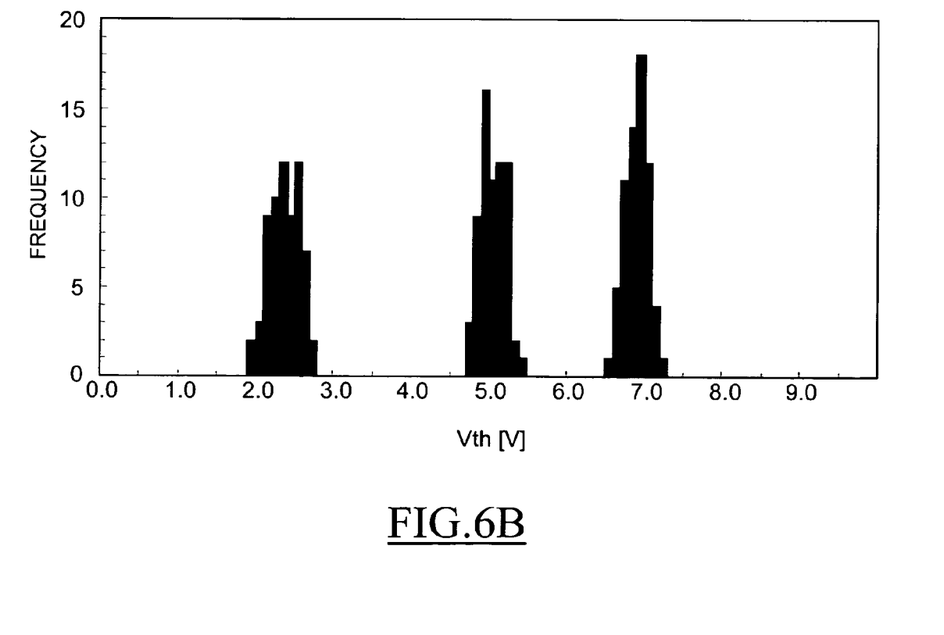
FIG. 6B shows a threshold voltage distribution of the N auxiliary cells of FIG. 4 peaked around three threshold voltage values obtained by a single-pulse program operation according to embodiments of the present invention.

It is observed that it is possible to obtain a threshold-voltage distribution having more pronounced peaks around different target threshold-voltage values. For example, in FIG. 6B a threshold-voltage distribution peaked around three threshold voltage values Vth, particularly roughly around 2.5 V, 5.2 V and 6.9 V, is shown; the bin width on the abscissa is of 100 mV. In the example of FIG. 6B, the auxiliary array includes 198 auxiliary cells and, thanks to given program biasing conditions (voltages and time periods), three threshold voltage distributions have been obtained around corresponding target threshold voltage values Vth.

It is pointed out that the present invention is not restricted to a particular mechanism of variation of the threshold voltage of the cells (e.g., injection of hot electrons, rather than tunneling effect) and it also applies in the case in which, instead of the programming, the erasure of the memory cells is exploited. For example, in FIG. 7 a graphic representation vs. time of the drain supply voltage Vdr is shown during a single-pulse erase operation on the auxiliary cells AC-1-AC-N according to a still further embodiment of the present invention.

Figure 7:
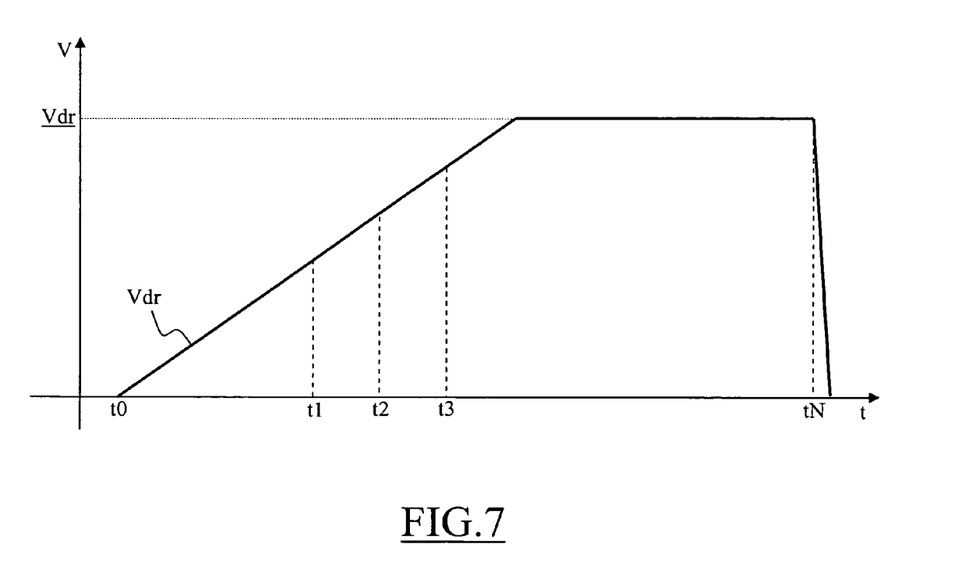
FIG. 7 is a graphic representation vs. time of a single voltage-erase pulse applied to the N auxiliary cells of FIG. 4, in the case of $E^2PROM$ cells of "Flotox" type, according to a still further embodiment of the present invention.

In this case, typical of an $E^2$PROM of "FloTOx" type, the drain voltage generator applies a single pulse to the drain voltage supply line Vdr and the drain supply voltage Vdr increases as a ramp, which starts at an initial time t0 and which reaches a maximum value Vdr (for example, a ramp going from about 0 V to about 12 V in 2 ms), while the gate voltage Vg is maintained at ground for the duration of the erase operation (it is supposed that all the involved cells has been previously programmed).

At the beginning of the single-pulse erase operation all the enabling signals EN-1-EN-N are asserted to keep all the switches SW-1-SW-N closed, i.e., all the column lines CL-1-CL-N are connected to the drain voltage supply line Vdr, as in the above-described embodiments.

When the drain supply voltage Vdr reaches, at a first time t1, a predetermined value, depending on a first one of the target threshold voltage value, a first enabling signal EN-1 is de-asserted for opening a first switch SW-1 corresponding to a first auxiliary cell AC-1. Accordingly, the first auxiliary cell AC is erased by a ramp pulse of duration t1-t0.

After a predefined time period T, at a second time t2 a second enabling signal EN-2 is de-asserted for opening a second switch SW-2 corresponding to a second auxiliary cell AC-2. Accordingly, the second auxiliary cell AC is erased with a ramp pulse of duration t2-t0 longer than t1-t0. Thus, the second auxiliary cell AC-2 typically has a threshold voltage lower than the threshold voltage of the first auxiliary cell AC-1.

Similarly, also the switches SW-3-SW-N are opened at respective times t3-tN and, then, the drain voltage pulse can rapidly decrease to zero. It has to be observed that only a portion of the auxiliary cells AC-1-AC-N is erased by a pulse reaching the maximum value Vdr, and also between them each auxiliary cell is erased by a pulse of a respective duration.

Furthermore, it has to be observed the modifying conditions of the threshold voltage (programming/erasure) of the different auxiliary cells may be varied, e.g. varying their respective biasing conditions, also by inducing slightly different voltage drops in the different column lines, for example, by exploiting slightly different loads coupled to the column lines.

After a single-pulse program (or erase) operation, if no auxiliary cell has reached the required threshold voltage value (the test machine verifies this by performing the search procedure among the auxiliary cells AC), then a further single-pulse program (or erase) operation can be performed, as, however, it occurs for programming (erasing) the memory cells MC in known E²PROM flash (or FLOTOX) memories. The new program (or erase) operation may be preceded by an erasure (re-programming) of the cells.

A further possibility is a "progressive" programming of the auxiliary cells (the same thing applies in the case of the erasure): initially, a program pulse adapted to set the lower threshold voltage value, corresponding, for example, to the depletion verify operation, is applied to the auxiliary cells; after identifying and choosing the auxiliary cell that will operate as reference for such an operation, the programming goes on for the remaining cells, which undergo a further program pulse, now adapted to set the threshold voltage value for the erase verify; again, after identifying and choosing the auxiliary cell that will operate as reference for that operation, the programming goes on for the remaining cells, which a program pulse adapted to set the read threshold voltage is applied to, and so on, until the cell to be exploited as reference for the program verify is identified and chosen.

A flash memory according to an embodiment of the present invention thus obtains the reference cells required for typical read, program verify, erase verify, depletion verify operations, and other possible operations in a relatively short time, typically shorter than the time required following the known procedure. In fact, it is not required to program single reference cells at desired levels, but a single program operation is performed on the plurality of auxiliary cells, and then a search is performed in the plurality of cells that have undergone a programming for identifying the auxiliary cell having the threshold voltage closest to the target one. The search can terminate when the desired reference cell is found, thus speeding-up the setting operation of the reference cells, because not all the auxiliary cells have to be read.

An advantage of the above-described embodiments of the present invention includes making the program algorithm much less sensitive to process variations, as that affecting the gate oxide thickness, the inter-poly dielectric thickness, the active area width, the gate length and the like, that in known memories have a strong effect on the characteristics of the cells, and accordingly on the programming efficiency. In the memory according to embodiments of the present invention, it is acceptable to have an even only rough knowledge of the cell behavior, in particular of the typical programming voltages to be applied to the terminals thereof, and then to row lines and column lines of the cell arrays. In fact, because a given number of auxiliary cells of the array 205 undergo a programming, it is possible to obtain a roughly uniform threshold-voltage distribution in a relatively wide voltage range and, accordingly, there is a relatively high probability of finding an auxiliary cell having a threshold voltage sufficiently close to the target value (within a predetermined tolerance), even in case of process variations.

A method according to an embodiment of the present invention can be exploited for obtaining reference cells for any purpose, such as the read, program-verify, erase-verify, depletion-verify, margin read operations. As described above, a different program pulse can be applied to different groups of auxiliary cells for obtaining different program levels, or the auxiliary cells can be sequentially disconnected from the program voltages, or the program biasing conditions of the different cells can be on purpose made slightly different from each other. It is further observed that similar results are obtained if instead of programming, the auxiliary cells undergo an erasure, or a combination of the two operations. In general, any operation allowing modifying an electrical characteristic, for example the threshold voltage of the auxiliary cells is acceptable.

It is observed that, although up to now reference is made to memories of flash type or E²PROM of FLOTOX type, this is not a limitation for the present invention, which may also apply also to other semiconductor memory types, in particular the phase-change memories (the so-called "ovonic" memories or OUM), in which the information is stored in terms of an electrical resistance value of a memory cell comprising a phase-change material element, a resistance of which varies appreciably in accordance to the phase (crystalline or amorphous).

The program operation on the auxiliary cells according to an embodiment of the present invention is especially useful for a built-in circuit designed for setting the reference cells. In fact, the method can be run in the background during an Electrical Wafer Sort (shortly, EWS) of the memory, without the need to keep an external testing machine busy and, therefore, without the need of an extra testing time. After the completion of the procedure of programming the auxiliary cells, in accordance with an embodiment of the present invention, the testing machine can take the control of the reference-cells setting procedure for performing a reading of the auxiliary cells and finding the auxiliary cells that have reached the desired program levels, so as to select them as reference cells for the future operating life of the memory.

The proposed solution can also be useful in the case in which it is necessary to adjust the threshold voltage value of the reference cells after the EWS, for example on the field. Thanks to the proposed solution, it is possible to avoid an erase operation and a further program operation on the reference cells. In fact, it is often sufficient to perform another search operation on the initially programmed auxiliary cells, and choosing a different auxiliary cell having the required threshold voltage value.

It has to be observed also that it is possible to exploit, as reference cells for a given operation, more than one auxiliary cell chosen among the auxiliary cells of the array 205, for example two or three auxiliary cells that have the threshold voltage values sufficiently close to the target value, so as to obtain a mean value closer to the corresponding target value of the single values, thus obtaining a greater accuracy. For example, three reference cells can be chosen among the auxiliary cells, and be connected in parallel to each other; dividing by three the resulting current allows obtaining a reference current closer to the target value than the individual currents of the three cells.

During the testing phase, after searching and choosing a reference cell between the programmed auxiliary cells, the corresponding address to be exploited during the operation of the flash memory is stored in a non-volatile manner. In the foregoing, this has been schematized by the registers 230 and 235 (FIG. 2).

The registers for storing the row and/or column address of the auxiliary cells chosen as reference cells can comprise, in conjunction with a non-volatile portion, a volatile portion, into which the data stored in a non-volatile way are loaded, for example at the memory power, for a faster access.

In an embodiment of the present invention, in order to further speed-up the program operation of the reference cells, during a search operation on the auxiliary cells AC of the array 205, the auxiliary cells AC can be read by means of the read/write circuits of the flash memory, particularly by means of the sense amplifiers, for reducing tasks of an external test machine.

Figure 8:
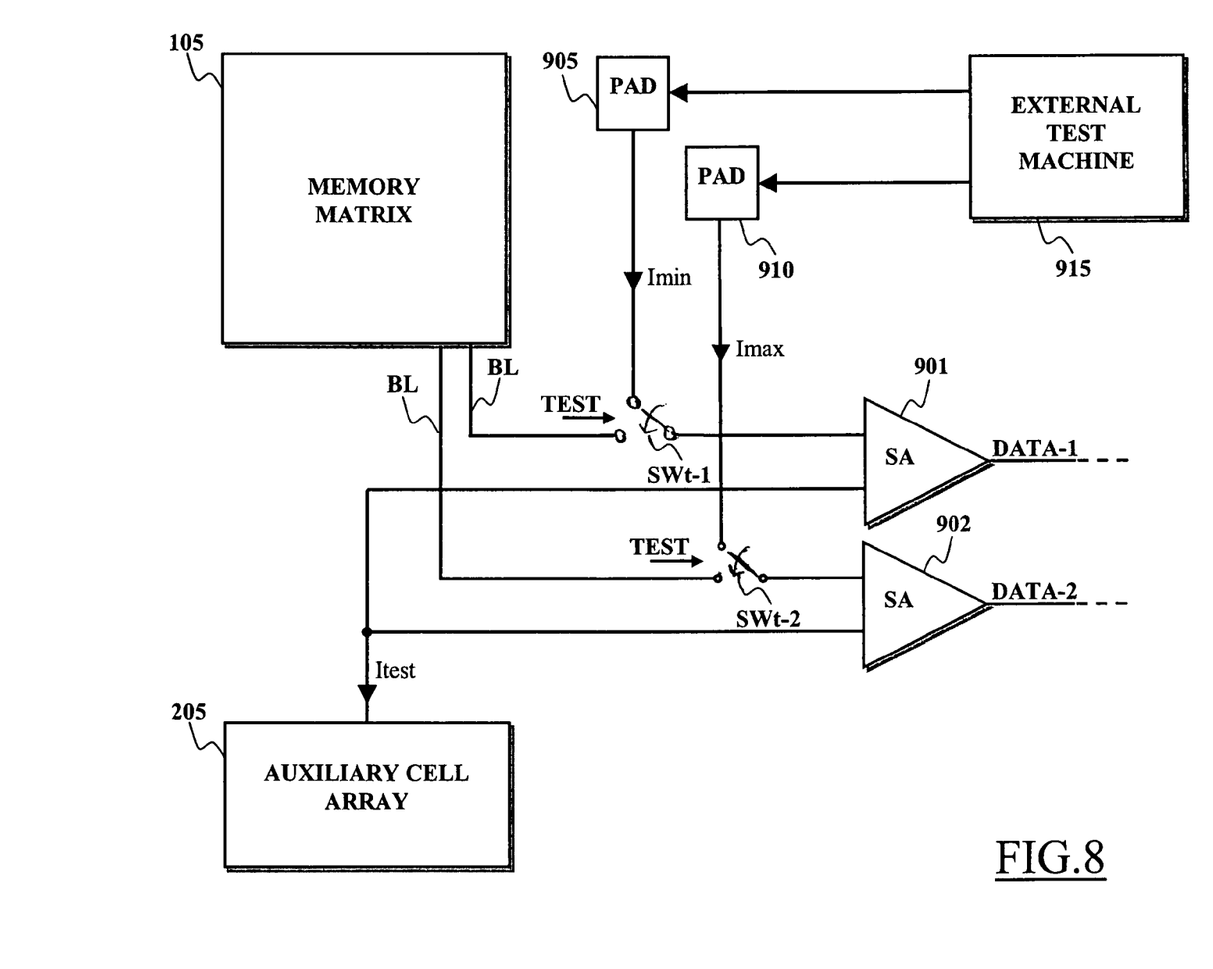
FIG. 8 shows two sense amplifiers dedicated to a search operation on the auxiliary cells, according to an embodiment of the present invention.

As shown in FIG. 8, in an embodiment of the present invention two sense amplifiers 901 and 902 of the sense amplifiers used for reading the cells MC are dedicated to the search operation of the auxiliary cells AC (the elements corresponding to those depicted in FIG. 1 and in FIG. 2 are denoted with the same reference numerals and their description is omitted for the sake of brevity).

An input terminal of the two dedicated sense amplifiers 901 and 902 is couplable, by means of two test switches SWt-1 and SWt-2 to a first pad 905 or to a second pad 910 of the flash memory, respectively, accessible from the outside, and for example, connected to an external test machine 915; the two test switches SWt-1 and SWt-2 are, for example, controlled by a test control signal TEST provided by the control unit 250 of the memory. In greater detail, the input terminals of the two dedicated sense amplifiers 901 and 902, couplable to the bit lines BL controlling the memory matrix 105, are connected to a first terminal of the respective test switch SWt-1, SWt-2. Respective second terminals of the test switches SWt-1 and SWt-2 are connected to a respective bit line BL and respective third terminals thereof are connected to a respective one among the first and second pads 905 and 910. In this way the input terminals of the sense amplifiers 901 and 902 are selectively couplable to a selected bit line BL or to a respective pad 905, 910 in accordance with the test control signal TEST.

Particularly, a first dedicated sense amplifier 901 has the input terminal coupled to the first pad 905 when the test control signal TEST is asserted, and coupled to a selected first bit line BL when the test control signal TEST is de-asserted. A second dedicated sense amplifier 902 has the input terminal coupled to the second pad 910 when the test control signal TEST is asserted, and coupled to a selected second bit line BL when the test control signal TEST is de-asserted.

Both the reference input terminals of the two dedicated sense amplifiers 902 are couplable to a same column line CL controlling the array 205 of auxiliary cells AC for sensing a current sunk by a selected auxiliary cell during the search operation (a suitable current mirror, not shown, can be provided to allow supplying the current Itest to both the sense amplifiers 901 and 902).

The external test machine 915 supplies a first test current Imin (for example, equal to 10 µA) and a second test current Imax (for example, equal to 10.5 µA) through the two pads 905 and 910, respectively, the first and the second test currents Imin and Imax slightly differing of an amount µI (in the considered example 0.5 µA) corresponding to a pre-defined tolerance on the target threshold voltage. In this way during a testing phase, when the test control signal TEST is asserted, a current Itest sunk by a properly biased auxiliary cell AC, depending on the respective threshold voltage and flowing through the respective column line CL, is compared by the two dedicated sense amplifiers 901 and 902 with the two currents Imin and Imax, the first test current Imin being lower than the second current Imax.

An output terminal of the first dedicated sense amplifier 901 provides an output signal DATA-1 corresponding to a result of the comparison between the current Itest and the first test current Imin. The output signal DATA-1 takes a high logic value '1' if the current Itest is greater than the first test current Imin, a low logic value '0' in the opposite case. An output terminal of the second dedicated sense amplifier 902 provides an output signal DATA-2 corresponding to a result of the comparison between the current Itest and the second test current Imax. The output signal DATA-2 takes a high logic value '1' if the current Itest is greater than the second test current Imin, a low logic value '0' in the opposite case.

If the current Itest falls in a current range between the first test current Imin and the second test current Imax, then the corresponding auxiliary cell AC is chosen as reference cell for the desired operation on the memory cells. In this case the output signal DATA-1 takes the high logic value '1', while the output signal DATA-2 takes the low logic value '0'. If the current Itest is lower than the first test current Imin or greater than the second test current Imax, then a search operation on the auxiliary cells goes on and a different column line CL is coupled to the pair of dedicated sense amplifiers 901, 902. In this case either the output signal DATA-1 takes the low logic value '0' or the output signal DATA-2 takes the high logic value '1'.

The first and second test currents Imin and Imax correspond to the required threshold voltage value and, accordingly, after a searching operation in which, for example, a read reference cell has been found, the respective values are changed for searching another reference cell, such as a program-verify, erase-verify, depletion-verify reference cell.

Alternatively, the test currents can be supplied by a current generator internal to the flash memory, instead of an external test machine, such as an un-balanced current mirror. More than two sense amplifiers can be exploited for the search operation and a corresponding algorithm can be implemented within a state machine.

Although the present invention has been disclosed and described by way of embodiments thereof, it is apparent to those skilled in the art that several modifications to the described embodiments, as well as other embodiments of the present invention are possible without departing from the scope thereof.

For example, the semiconductor memory can be different from a flash memory, e.g., it can be a FLOTOX E$^2$PROM memory or an OUM memory, and an embodiment of the present invention can be applied, for example, in an EPROM. The array of auxiliary cells can be arranged in a different way or alignments of auxiliary cells can be included in the memory matrix 105. The addresses of the reference cells can be hardwired in the memory in place of using non-volatile registers. Different programming algorithms can be exploited in place of ramp pulses and of control lines sequentially disconnected.

Furthermore, the circuitry disclosed in FIGS. 2-8 may be included in an integrated circuit (IC) such as a processor or a memory IC (similar to that shown in FIG. 1), and such an IC may be included in an electronic system such as a computer system.

The invention claimed is:
1. A semiconductor memory device including at least one reference cell adapted to be exploited as a generator of a reference signal, the reference signal depending on a value of an electrical characteristic of the at least one reference cell, the memory device further including:
a population of data storage cells;
a population of auxiliary cells;
means for operating on the auxiliary cells of said population for varying a value of the electrical characteristic thereof in such a way that the varied values are distributed in a range including a value corresponding to said reference signal; and means for choosing the at one least one reference cell among the population of auxiliary cells having the value of the electrical characteristic closest to the value corresponding to the reference signal with a pre-defined tolerance.

2. The semiconductor memory device of claim 1, further comprising:

a population of dummy cells.

3. The semiconductor memory device of claim 2, wherein the auxiliary cells and the dummy cells are structurally identical to the data storage cells.

4. The semiconductor memory device of claim 2, wherein the dummy cells provide a boundary frame for the auxiliary cells.

* * * * *